(12) United States Patent
Pellizzer et al.

(10) Patent No.: US 10,497,863 B2
(45) Date of Patent: *Dec. 3, 2019

(54) METHOD, SYSTEM, AND DEVICE FOR L-SHAPED MEMORY COMPONENT

(71) Applicant: Micron Technology, Inc., Boise, ID (US)

(72) Inventors: Fabio Pellizzer, Boise, ID (US); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/858,794

(22) Filed: Dec. 29, 2017

(65) Prior Publication Data

US 2018/0145250 A1  May 24, 2018

Related U.S. Application Data (62) Division of application No. 15/598,051, filed on May 17, 2017, now abandoned, which is a division of application No. 13/224,268, filed on Sep. 1, 2011, now abandoned.

(51) Int. Cl.
*H01L 45/00* (2006.01)
*H01L 27/24* (2006.01)

(52) U.S. Cl.
CPC .......... *H01L 45/06* (2013.01); *H01L 27/2427* (2013.01); *H01L 27/2463* (2013.01); *H01L 45/124* (2013.01); *H01L 45/1691* (2013.01)

(58) Field of Classification Search
CPC ... H01L 45/06; H01L 45/124; H01L 27/2427; H01L 27/2463
See application file for complete search history.

(56) References Cited

U.S. PATENT DOCUMENTS

| | | |
|---|---|---|
| 7,265,050 B2 | 9/2007 | Choi et al. |
| 7,400,522 B2 * | 7/2008 | Toda ................. G11C 13/0004 365/148 |
| 7,466,584 B1 | 12/2008 | Parkinson et al. |
| 7,569,845 B2 | 8/2009 | Chen et al. |
| 7,569,847 B2 | 8/2009 | Majumdar et al. |
| 7,655,938 B2 * | 2/2010 | Kuo .................... H01L 27/2427 257/2 |

(Continued)

OTHER PUBLICATIONS

Wong, et al., "Phase Change Memory", Proceedings of the IEEE, Dec. 2010, vol. 98, No. 12, IEEE 2010., 27 pgs.

*Primary Examiner* — Allison Bernstein
(74) *Attorney, Agent, or Firm* — Holland & Hart LLP (57) ABSTRACT

Embodiments disclosed herein may relate to forming reduced size storage components in a cross-point memory array. In an embodiment, a storage cell comprising an L-shaped storage component having an approximately vertical portion extending from a first electrode positioned below the storage material to a second electrode positioned above and/or on the storage component. A storage cell may further comprise a selector material positioned above and/or on the second electrode and a third electrode positioned above and/or on the selector material, wherein the approximately vertical portion of the L-shaped storage component comprises a reduced size storage component in a first dimension.

18 Claims, 9 Drawing Sheets

(56) References Cited

U.S. PATENT DOCUMENTS

| | | |
|---|---|---|
| 7,800,933 B2 | 9/2010 | Kumar et al. |
| 7,876,605 B2 | 1/2011 | Haring-Bolivar et al. |
| 8,062,940 B2 | 11/2011 | Ko et al. |
| 8,183,602 B2 | 5/2012 | Tabata et al. |
| 8,377,741 B2 | 2/2013 | Savransky et al. |
| 8,569,734 B2 | 10/2013 | Redaelli et al. |
| 2009/0134432 A1 | 5/2009 | Tabata et al. |
| 2010/0038617 A1* | 2/2010 | Nakajima ............... H01L 27/24 257/2 |
| 2010/0176365 A1 | 7/2010 | Park et al. |
| 2011/0155989 A1 | 6/2011 | Park et al. |
| 2011/0278528 A1* | 11/2011 | Lung ................ H01L 27/2454 257/2 |

* cited by examiner

METHOD, SYSTEM, AND DEVICE FOR L-SHAPED MEMORY COMPONENT

CROSS-REFERENCE

This present application for patent is a divisional of U.S. patent application Ser. No. 15/598,051 by Pellizzer et al., entitled "Method, System, And Device For L-Shaped Memory Component," filed May 17, 2017, which is a divisional of U.S. patent application Ser. No. 13/224,268 by Pellizzer et al., entitled "Method, System, and Device for L-Shaped Memory Component," filed Sep. 1, 2011, assigned to the assignee hereof, and each of which is expressly incorporated by reference in its entirety herein.

BACKGROUND

Field

Subject matter disclosed herein may relate to integrated circuit devices, and may relate, more particularly, to circuitry related to a memory array.

Information

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering a memory device's suitability for any particular application may include, physical size, storage density, operating voltages, granularity of read/write operations, throughput, transmission rate, and/or power consumption, for example. Other example factors that may be of interest to system designers include cost of manufacture, and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding and/or analogous elements. It will be appreciated that elements illustrated in the figures have not necessarily been drawn to scale, such as for simplicity and/or clarity of illustration. For example, dimensions of some elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering a memory device's suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part determine at least some of the factors, such as those mentioned above, including storage density, physical size, and/or cost/ease of manufacture, for example.

An example process for forming one or more storage components in a phase change with selector (PCMS) memory array may comprise depositing a storage component material over and/or on an insulation layer having one or more trenches formed therein to affect a first dimension of one or more storage components. An example process may further comprise forming one or more trenches in one or more materials of the memory array to affect a second dimension of the storage components at least in part through a lithographic operation utilizing a reduced pitch mask. In an embodiment, for example, relatively high density storage arrays may be accomplished while reducing programming current.

In an example embodiment, individual storage components may comprise an "L" shape, wherein an approximately vertical portion of an "L" shape comprises an aspect ratio at least partially affected by a thickness of a deposition of storage component material on an approximately vertical wall of a trench in one dimension and by an additional trench formed in an approximately orthogonal direction using a reduced pitch photolithographic mask in another dimension. A reduced aspect ratio, for example, may allow for a reduction in programming current. Also in an example embodiment, a horizontal portion of the "L" shaped storage component, hereafter called lower leg of an "L" shape, for an individual storage component may contact an electrode positioned between a storage component and a selector. A lower leg of an "L" shaped storage component may provide increased contact area with an electrode, providing an improved electrical connection with reduced resistance and further help increase yield during manufacturing. In one or more example embodiments, an increased contact area between a storage component and an electrode may be provided while still providing a reduced aspect ratio storage component. In this manner, reduced programming current may be achieved and improved manufacturing yield may also be achieved. However, claimed subject matter is not limited in scope in these respects.

Figure 1:
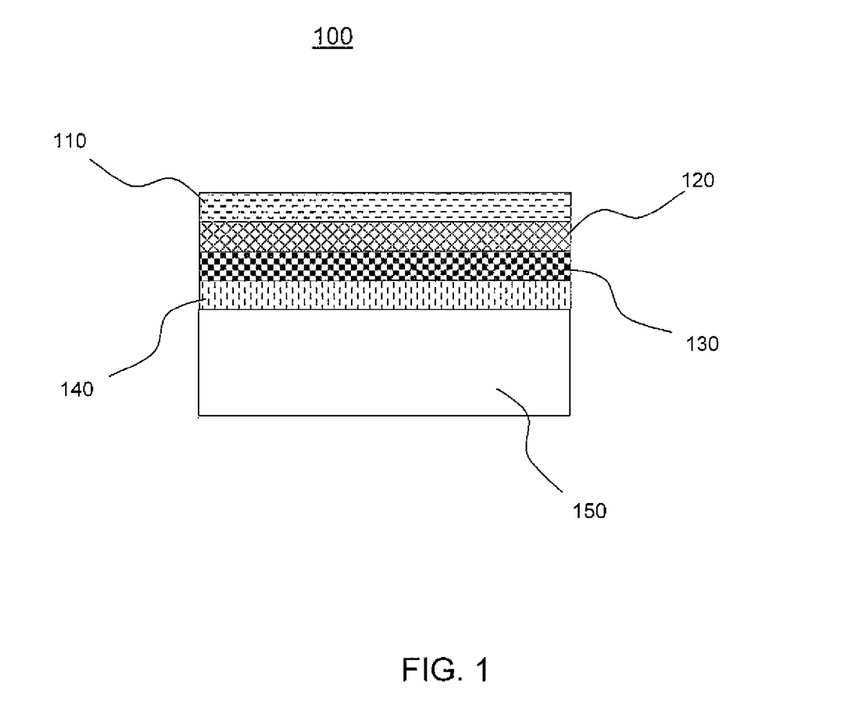
FIG. 1 is an illustration depicting a cross-sectional view of a phase change memory with a selector (PCMS) device, according to an embodiment.

FIG. 1 is an illustration depicting a cross-sectional view of an example embodiment 100 of a memory array. In an embodiment, memory array 100 may comprise a phase change memory switch (PCMS) array. A PCMS device may also be referred to as a "phase change memory with selector" device. For an embodiment, a phase change memory switch device, such as PCMS 100, may be implemented as a cross-point memory array. In an embodiment of a PCMS cross-point array, a plurality of approximately orthogonally directed electrically conductive lines, referred to as "electrodes", may be formed, with one subset of orthogonally directed electrodes in a material positioned below an array of storage components and another subset of orthogonally directed electrodes in a material positioned above the array of storage components. As used herein, the term "cross-point memory array" refers to a memory array having two or more approximately orthogonally directed sets of electrodes. For example, as depicted in FIG. 1, an example embodiment of a cross-point memory array may comprise one set of electrodes, such as electrodes depicted in electrode material 110, positioned along a direction approximately orthogonal to a direction of another set of electrodes, such as electrodes depicted in electrode material 140.

An electrically conductive component, such as an "electrode", refers to component that may be utilized to route signals and/or supply voltages within a metal material and/or within a memory array. An electrically conductive component, such as an electrode, may comprise a sufficiently electrically conductive material, such as polysilicon, carbon, and/or metallic material, such as tungsten, titanium nitride, and/or titanium aluminum nitride, for example, for use in a memory device. Of course, claimed subject matter is not limited in scope in these respects. Other materials may, of course, also be used in an embodiment.

In an embodiment, an electrode material, such as electrode material 140, may be formed above one or more materials, such as material 150, comprising one or more semiconductor materials and/or one or more metal materials. An electrode material, such as electrode material 110, may be positioned above a selector material, such as material 120, and/or a storage component material, such as material 130, in an embodiment. Semiconductor and metal material 150 may, for example, comprise one or more decoder circuits, such as one or more data/sense lines, for example a bit-line, decoder circuits and/or one or more access lines, for example a word-line, decoder circuits, in an embodiment. Semiconductor and metal material 150 may further comprise, in an embodiment, one or more metal materials comprising electrodes utilized to route signals and/or supply voltages to electrode material 140 and/or electrode material 110, in an embodiment. For example, semiconductor and metal material 150 may comprise electrically conductive interconnect that may electrically couple a decoder circuit to an electrode in electrode material 140, although claimed subject matter is not limited in this respect.

In an embodiment, electrically conductive electrodes of electrode material 140 may lie along a direction approximately orthogonal to a direction of electrically conductive electrodes of electrode material 110. Also, in an embodiment, a storage component material 130, and/or a selector material, such as selector material 120, may be formed and/or positioned between two or more electrode materials, such as electrode material 140 and/or electrode material 110, in an embodiment.

Also, in an example embodiment, one or more decks of memory may be formed. For example, memory device 100 may comprise a one-deck memory array. Other embodiments may comprise a greater amount of decks. For example, other embodiments may comprise four decks, although claimed subject matter is not limited in this respect. As used herein, a "deck" of memory may comprise an array of memory cells and a plurality of electrodes. For example, a first deck may comprise a plurality of access line, for example word-line, electrodes, an array of storage components formed over and/or on a plurality of word-line electrodes, and a plurality of bit-line electrodes formed over and/or on a plurality of storage components, for example. A second deck may comprise a plurality of bit-line electrodes shared with a first deck and may further comprise an additional array of storage components positioned over and/or on a plurality of bit-line electrodes, according to an embodiment. Also, for a second deck, an additional plurality of word-line electrodes may be formed over and/or on an additional array of storage components. Of course, claimed subject matter is not limited in scope in these respects.

For a memory array, such as PCMS array 100, a storage component may comprise a chalcogenide glass material, in an embodiment. A PCMS storage component may be configured to retain or store memory in at least two different selectable states. For example in a binary system, the states are considered either a "0" or a "1,", where a "set" state, representing a binary value of '1', for example, may correspond to a more crystalline, more conductive state for a material of a storage component and a "reset" state, representing a binary value of '0', for example, corresponding to a more amorphous, more resistive state of a storage component material. In other systems, at least some individual memory cells may be configured to store more than two levels or states of information. In a PCMS memory array, heat sufficient to change a phase of a storage component may be achieved by application of a current and/or voltage pulse to the storage component, in an embodiment. Further, in one or more example embodiments, cross-point memory arrays may comprise one or more technologies other than PCMS, such as resistive memory technologies and/or other types of memory, and claimed subject matter is not limited in scope in this respect.

Figure 2:
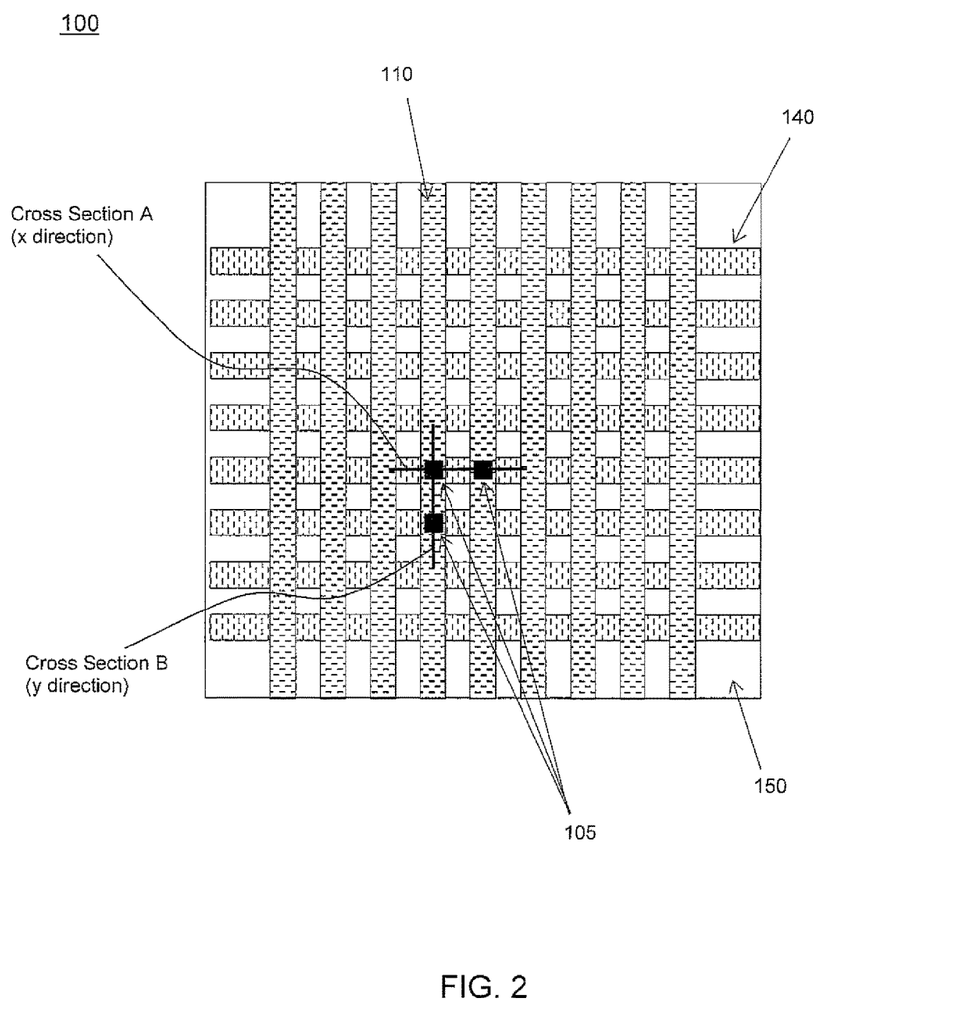
FIG. 2 is an illustration depicting a top view of a portion of a memory device, according to an embodiment.

FIG. 2 is an illustration depicting a top view of a portion of example PCMS cross-point memory array 100. Depicted in FIG. 2 is an electrode material 110 comprising a plurality of electrically conductive electrodes laying in a direction and an electrode material 140 comprising a plurality of electrically conductive electrodes laying in a direction approximately orthogonal to the direction of electrode material 110. FIG. 2 additionally shows cross-sectional line segments 'A', and 'B' that correspond to cross sectional views A and B. In an embodiment, a storage component 105 of PCMS array 100, located between electrode materials 110 and/or 140, may be selected and/or accessed in part by energizing appropriate electrodes in electrode material 140 and/or electrode material 110. For an example, PCMS cross-point memory array, such as array 100, one or more driver circuits, such as one or more word-line driver circuits and/or one or more bit-line driver circuits, may transmit one or more signals, such as one or more word-line select signals and/or one or more bit-line select signals, to one or more electrodes of electrode material 110 and/or electrode material 140. In an embodiment, electrode material 140 may comprise a plurality of word-line electrodes, for example. Also, in an embodiment, electrode material 110 may comprise a plurality of bit-line electrodes, although claimed subject matter is not limited in these respects. By transmitting a word-line select signal to a word-line electrode of electrode material 140 and/or by transmitting a bit-select signal to a bit-line electrode of electrode material 110 a particular storage component within array 100 may be selected, for example.

In one or more embodiments, it may be advantageous to provide higher density storage arrays, for example, while also providing reduced storage component programming current. It may further be advantageous to provide higher density storage arrays and/or reduced storage component programming current without significantly increasing cost and/or difficulty of manufacture, for example. Of course, claimed subject matter is not limited in these respects. These are merely non-limiting examples.

As mentioned previously, an example process for forming one or more storage components in a phase change with selector (PCMS) memory array may comprise depositing storage component material over and/or on one or more trenches in a dielectric material to decrease die size. One or more trenches may be formed in an area above a plurality of rows individually comprising an electrode and a selector such that bottom portions of a storage component may contact an electrode positioned between a storage component and a selector, in an embodiment. An example process may further comprise forming a trench in a material of the memory array to affect a size of the storage components at least in part through a lithographic operation utilizing a reduced pitch mask. Individual storage components may comprise an "L" shape, wherein an approximately vertical portion of an "L" shape comprises an aspect ratio at least partially affected by a thickness of a deposition of storage component material on an approximately vertical wall of a trench in one dimension and by an additional trench formed in an approximately orthogonal direction using a reduced pitch photolithographic mask in another dimension. A reduced aspect ratio, for example, may allow for a reduction in programming current. Also in an example embodiment, a horizontal portion of the "L" shaped storage component, hereafter called lower leg of an "L" shape, for an individual storage component may contact an electrode positioned between a storage component and a selector. A lower leg of an "L" shaped storage component may provide increased contact area with an electrode, providing an improved electrical connection with reduced resistance and further help increase yield during manufacturing. In one or more example embodiments, an increased contact area between a storage component and an electrode may be provided while still providing a reduced aspect ratio storage component. However, claimed subject matter is not limited in scope in these respects.

Figure 3A:
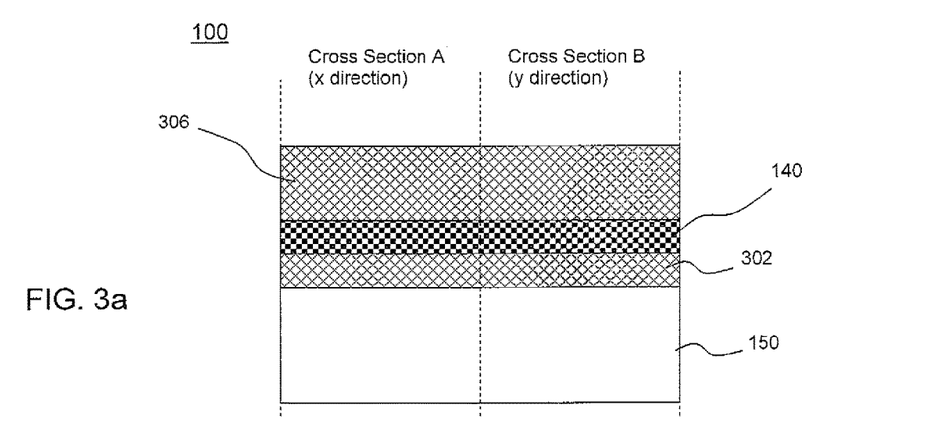
FIG. 3a is an illustration depicting a cross-sectional view of a portion of an example technique for forming storage components in a cross-point memory array, according to an embodiment.

FIGS. 3a through 3k illustrate a process of forming PCMS 100 in accordance with an embodiment of the present technology. Referring to FIG. 3a, Cross Section A depicts a cross-sectional view of a portion of PCMS array 100 looking in an 'x' direction, and Cross Section B depicts a cross-sectional view of a portion of PCMS array 100 looking in a 'y' direction that is approximately orthogonal to an 'x' direction. FIGS. 3a through 3k depict an example technique for forming at least some aspects of PCMS array 100. Of course, claimed subject matter is not limited in scope to the particular examples described herein and as depicted in FIGS. 3a through 3k.

As illustrated in FIG. 3a, a dielectric material 302, such as a nitride, may be formed by deposition and/or other known processes over and/or on a semiconductor and metal material 150, in an embodiment. Also in an embodiment, a material, such as tungsten, may be deposited or otherwise formed by known methods over and/or on a dielectric, such as a nitride, to produce an electrode material 140. Electrode material 140 may further comprise, for example, platinum, carbon, titanium nitride, and/or titanium aluminum nitride, among others, in an embodiment. Dielectric material 302 may comprise, for example, silicon nitride and/or silicon oxynitride, in an embodiment. Embodiments are not limited to a particular type of dielectric material or electrode material. Note that at this point in an example process, electrode material 140 may comprise a deposited sheet of material, and so may not yet comprise individual electrodes. In an implementation, electrode material 140 may eventually comprise one or more electrodes approximately in parallel and approximately along an 'x' direction. Also, in an embodiment, an additional dielectric material 306 may be formed by deposition and/or other known processes over and/or on electrode material 140, for example. Dielectric material 306 may comprise, for example, silicon nitride and/or silicon oxynitride, in an embodiment.

Figure 3B:
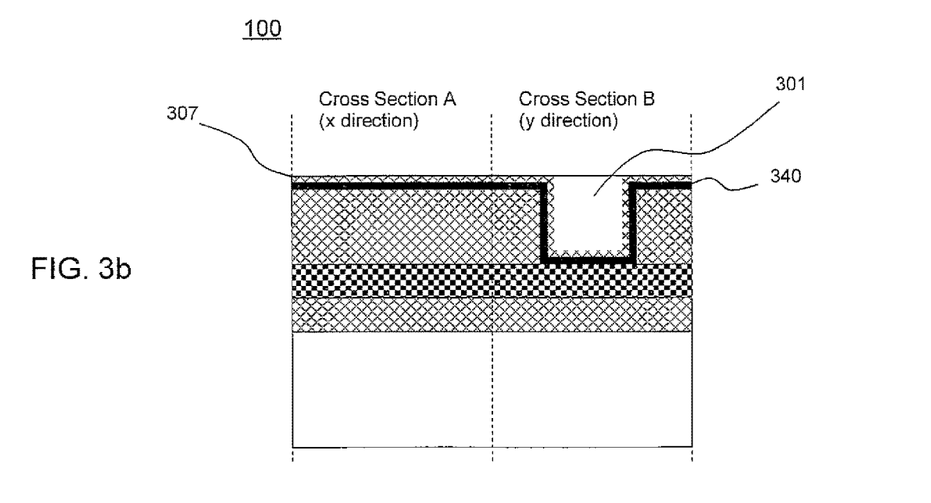
FIG. 3b is an illustration depicting a cross-sectional view of an additional portion of an example technique for forming storage components in a cross-point memory array, according to an embodiment.

FIG. 3b shows a subsequent stage of the process following the process described in FIG. 3a. As illustrated in FIG. 3b, a trench 301 may be formed by etching and/or other known processes in a dielectric material 306, for example. In an embodiment, an etching process may stop approximately at electrode material 140, for example. In an embodiment, a photoresist etch mask may be formed utilizing a lithographic technique, for example, to substantially protect PCMS array 100 outside of an area designated for trench 301 during an etching process, although the scope of claimed subject matter is not limited in this respect. A storage component material 340 may be formed by deposition and/or other known processes over and/or on a surface of PCMS array 100, including within trench 301. In an embodiment, storage component material 340 may be deposited in a conformal manner. In an embodiment, storage component material 340 may comprise a chalcogenide glass material, for example. An additional dielectric material 307 may be formed by deposition and/or other known processes over and/or on storage component material 340, in an embodiment. Dielectric material 307 may comprise, for example, silicon nitride and/or silicon oxynitride, in an embodiment. Again, other materials are also possible in other embodiments.

Figure 3C:
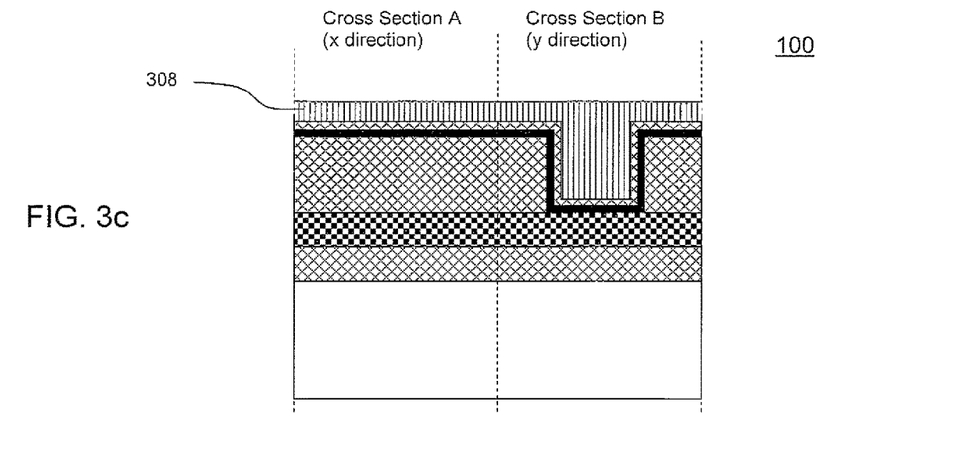
FIG. 3c is an illustration depicting a cross-sectional view of a subsequent processing step of a portion of an example technique for forming storage components in a cross-point memory array, according to an embodiment.

FIG. 3c shows a subsequent stage of the process following the process described in FIG. 3b. As illustrated in FIG. 3c, a dielectric material 308, such as an oxide, may be formed by deposition and/or other known processes over and/or on PCMS array 100, including filling trench 301. In an embodiment, dielectric material 308 may comprise silicon oxide, for example.

Figure 3D:
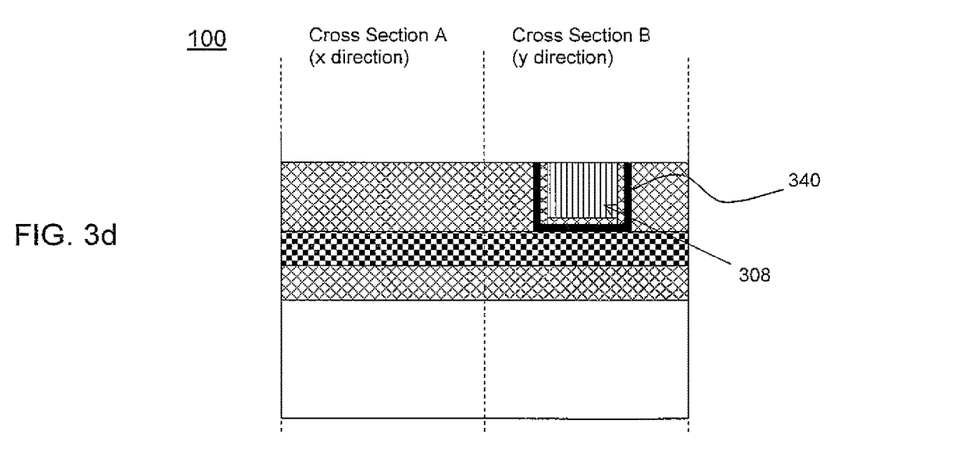
FIG. 3d is an illustration depicting a cross-sectional view of a subsequent processing step of a portion of an example technique for forming storage components in a cross-point memory array, according to an, embodiment.

FIG. 3d shows a subsequent stage of the process following the process described in FIG. 3c. As illustrated in FIG. 3d, PCMS array 100 may be substantially planarized to remove portions of dielectric material 308 not within trench 301 and/or storage component material 340 not within trench 301. Planarization, in an embodiment, may further expose portions of storage component material 340 at a top surface of PCMS 100. Also, in an embodiment, an example planarization process may comprise a chemical/mechanical polish (CMP) technique, although claimed subject matter is not limited in scope in this respect. As used herein, the term "wall" as it relates to a trench refers to an approximately vertical boundary of a trench formed, for example, by an etching process.

Figure 3E:
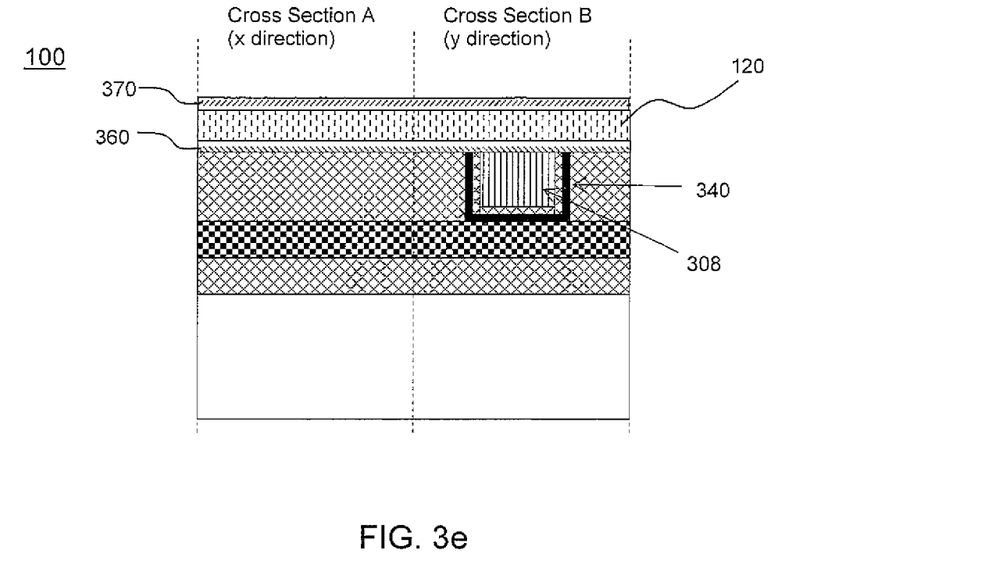
FIG. 3e is an illustration depicting a cross-sectional view of a subsequent processing step of a portion of an example technique for forming storage components in a cross-point memory array, according to an embodiment.

FIG. 3e shows a subsequent stage of the process following the process described in FIG. 3d. As depicted in FIG. 3e, an electrode material, such as middle electrode 360, may be formed by deposition and/or other known processes over and/or on PCMS array 100. In an embodiment, middle electrode 360 may comprise carbon, titanium nitride, and/or titanium aluminum nitride, for example, although claimed subject matter is not limited in this respect. Additionally, a selector material 120 may be formed by deposition and/or other known processes over and/or on middle electrode 360. In an embodiment, selector material 120 may comprise a chalcogenide glass material. However, in an embodiment, selector material 120 may comprise a different chalcogenide material than that utilized for storage component material 340.

Figure 3F:
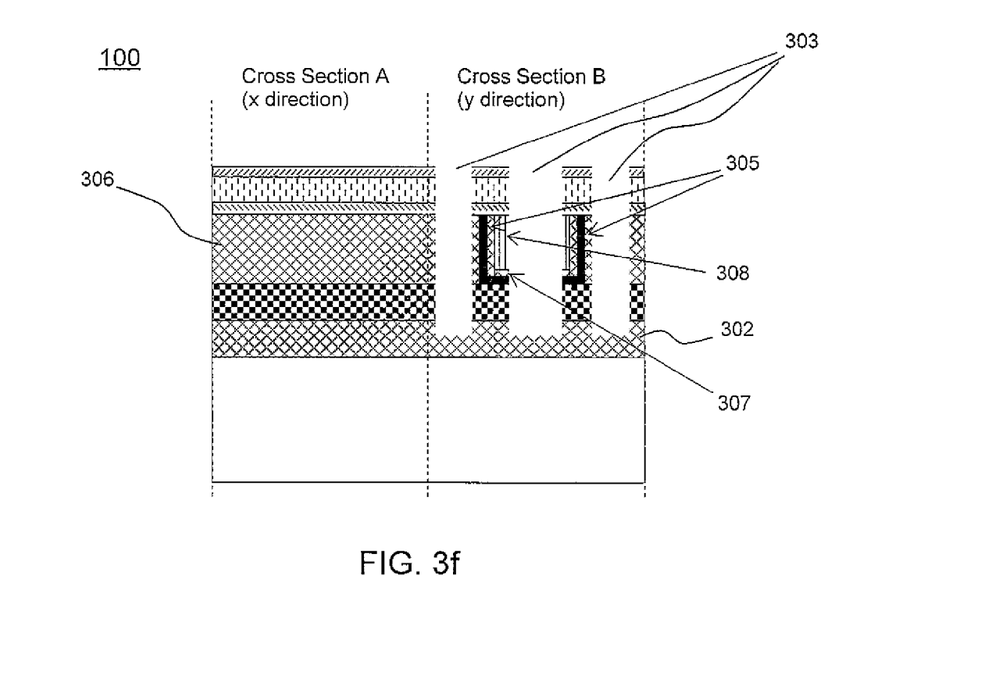
FIG. 3f is an illustration depicting a cross-sectional view of a subsequent processing step of a portion of an example technique for forming storage components in a cross-point memory array, according to an embodiment.

FIG. 3f shows a subsequent stage of the process following the process described in FIG. 3e. FIG. 3f illustrates a plurality of trenches, such as trenches 303, formed by etching and/or other known processes in PCMS array 100 to provide a plurality of rows along a 'y' direction. In an embodiment, an example etching process may etch upper electrode 370, selector material 120, and/or middle electrode 360, as illustrated by trenches 303 in FIG. 3f. An example etching process may further etch dielectric material 308 previously deposited in trench 301 and/or a portion of an approximately horizontal section of storage component material 340 previously positioned at a bottom of trench 301, as also illustrated by trenches 303. Additionally, in an embodiment, an example etching process may etch through sections of dielectric material 306 and further may partially etch sections of dielectric material 302, as additionally illustrated by trenches 303.

During etching, in an example embodiment, components of storage component material 340 located within filled trench 301 may be partially and/or substantially protected by portions of dielectric material 308 and/or by portions of dielectric material 307 located within filled trench 301, except for portions of storage component material 340 at the bottom of trench 301. An example etching process may form a plurality of individual electrodes in electrode material 140, in an embodiment. In an embodiment, a plurality of electrodes of electrode material 140 may comprise a plurality of word-line electrodes for PCMS array 100, although claimed subject matter is not limited in this respect.

An example etching process may further partially and/or substantially result in forming storage components 305, in an embodiment. Storage components 305 may, in an example embodiment, comprise an "L-shaped storage component. In an embodiment, storage components 305 may be formed in one dimension in accordance with a deposition of storage component material over and/or on approximately vertical walls of a trench, such as trench 301. In an embodiment, a width of a storage component in a dimension formed by deposition of storage component material may comprise a width that is smaller than would otherwise be available through conventional lithographic techniques. In this manner, a reduced size storage component relative to standard pitch, for example, for a PCMS array, such as PCMS array 100, may be realized.

Figure 3G:
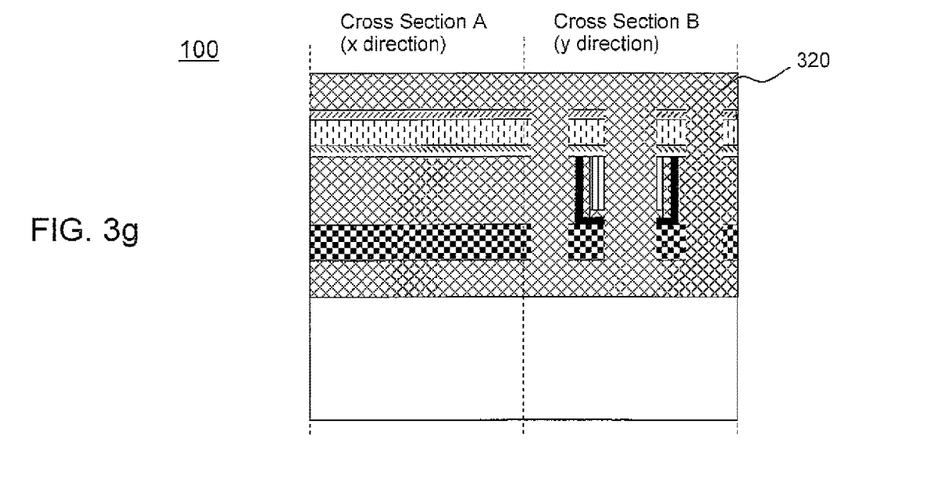
FIG. 3g is an illustration depicting a cross-sectional view of a subsequent processing step of a portion of an example technique for forming storage components in a cross-point memory array, according to an embodiment.

FIG. 3g shows a subsequent stage of the process following the process described in FIG. 3f. As illustrated in FIG. 3g, trenches 303 may be filled by deposition of additional dielectric material, such as nitride 320, to provide some additional stability and/or electrical isolation, for example. Nitride 306 may comprise, for example, silicon nitride and/or silicon oxynitride, in an embodiment, although claimed subject matter is not limited in scope in this respect.

Figure 3H:
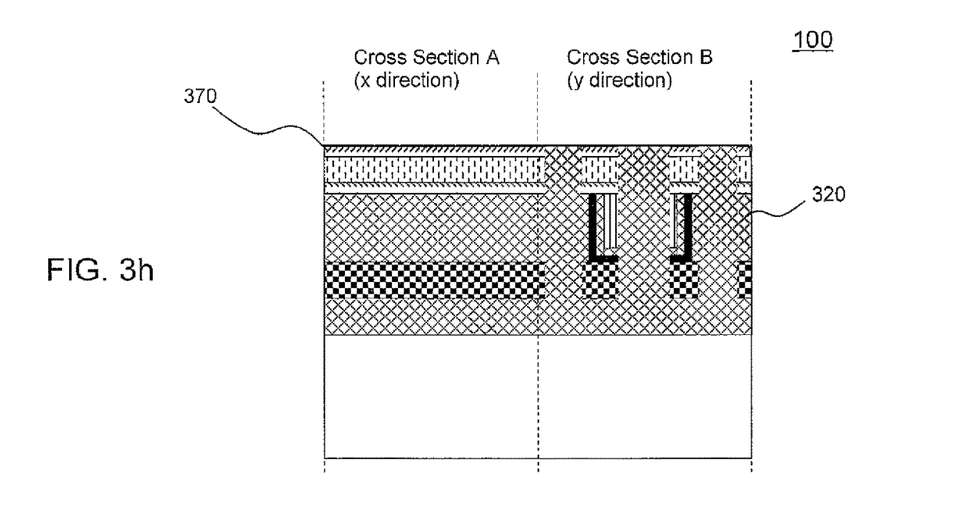
FIG. 3h is an illustration depicting a cross-sectional view of a subsequent processing step of a portion of an example technique for forming storage components in a cross-point memory array, according to an embodiment.

FIG. 3h shows a subsequent stage of the process following the process described in FIG. 3g. As depicted in FIG. 3h, dielectric material, such as nitride 320, may be planarized until upper electrode 370 is substantially exposed. Also, in an embodiment, an example planarization process may comprise a CMP technique, although claimed subject matter is not limited in scope in this respect.

Figure 3I:
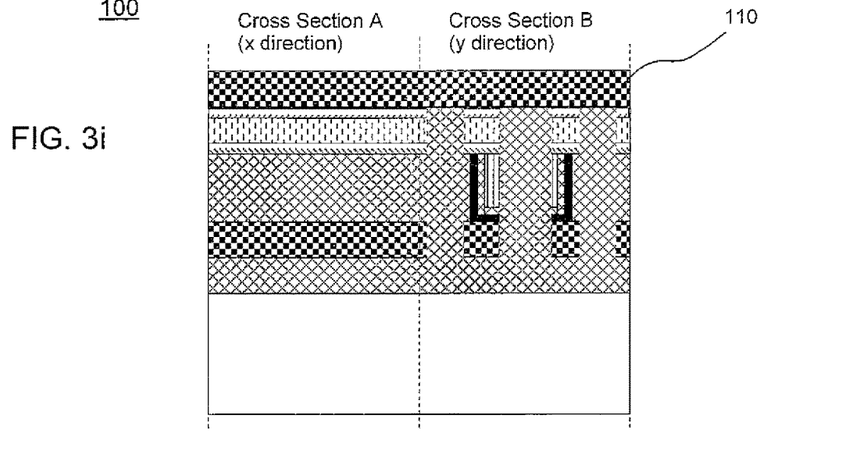
FIG. 3i is an illustration depicting a cross-sectional view of a subsequent processing step of a portion of an example technique for forming storage components in a cross-point memory array, according to an embodiment.

FIG. 3i shows a subsequent stage of the process following the process described in FIG. 3h. As illustrated at FIG. 3i, a metallic material, such as tungsten, may be formed by deposition and/or other known processes over and/or on PCMS array 100 to form electrode material 110. Electrode material 110 may further comprise, for example, platinum, carbon, titanium nitride, and/or titanium aluminum nitride, among others, in an embodiment.

Figure 3J:
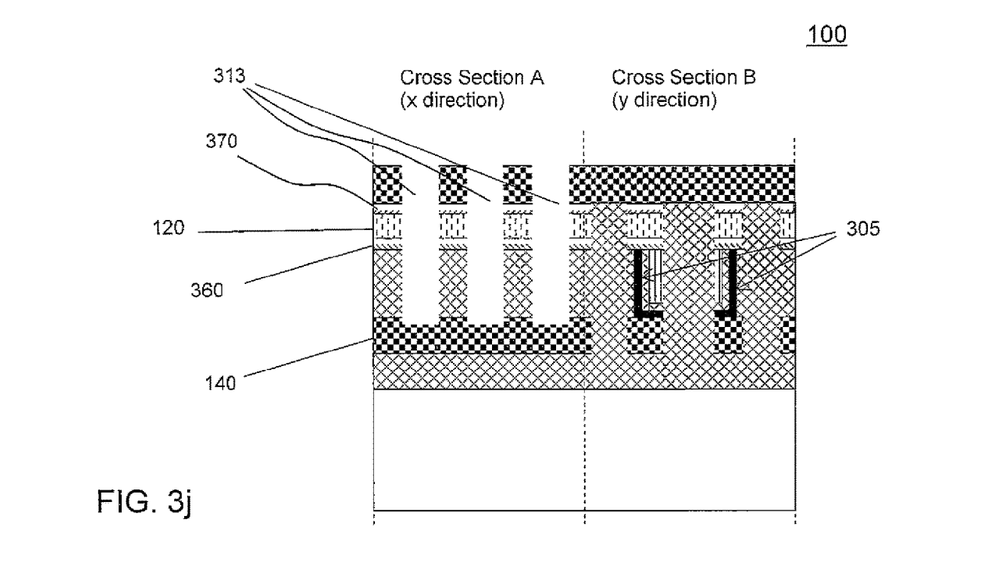
FIG. 3j is an illustration depicting a cross-sectional view of a subsequent processing step of a portion of an example technique for forming storage components in a cross-point memory array, according to an embodiment.

FIG. 3j shows a subsequent stage of the process following the process described in FIG. 3i. As depicted in FIG. 3j, a plurality of trenches 313 may be formed by etching and/or other known processes into PCMS array 100. In an embodiment, trenches 313 may be positioned along a direction approximately orthogonal to trenches 303. In an embodiment, an example etching process may etch sections of electrode material 110, upper electrode 370, selector material 120, middle electrode 360, and/or dielectric material 306. Also, an example etching process in accordance with an embodiment may etch electrode material 140, at least partially. In an example embodiment, an anisotropic etch may be used.

In an embodiment, an etching process may be accomplished utilizing a photolithographic operation. During the etch process, portions of PCMS array 100 not intended to be etched may be protected by a mask. Additionally, it may be noted that trenches, such as trenches 313, may define an additional dimension of an aspect ratio, also referred to as a cross-section, of approximately vertical portions of one or more storage components, such as storage components 305. In this manner, one dimension of an aspect ratio, or cross section, of approximately vertical portions of storage components 305 may be at least partially affected by a thickness of a deposition of storage component material on a wall of trench 301, and another dimension of an aspect ratio, or cross-section, of approximately vertical portions of storage components 305 may at least partially be affected by an example etching process utilizing a lithographic operation. However, claimed subject matter is not limited in scope in these respects.

Figure 3K:
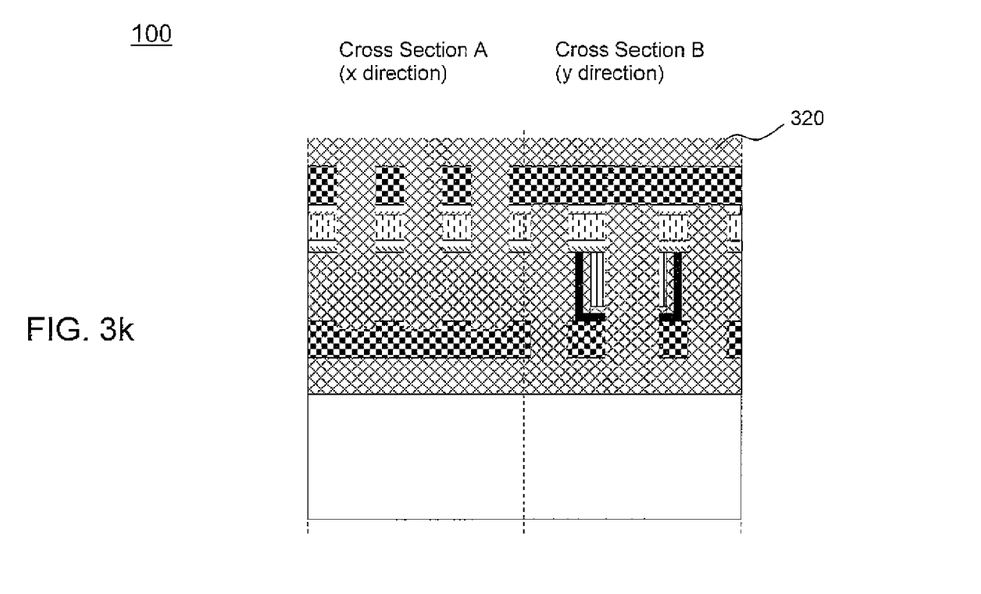
FIG. 3k is an illustration depicting a cross-sectional view of a subsequent processing step of a portion of an example technique for forming storage components in a cross-point memory array, according to an embodiment.

FIG. 3k shows a subsequent stage of the process following the process described in FIG. 3j. As illustrated in FIG. 3k, additional dielectric material, such as nitride 320, may be deposited over and/or on PCMS 100 and within trenches 313 to encapsulate storage components 305, in an embodiment, for example. Deposition of additional dielectric material 320 may provide structural stability, as well as electrical isolation for individual aspects of PCMS array 100. However, claimed subject matter is not limited in scope in these respects.

Figure 4:
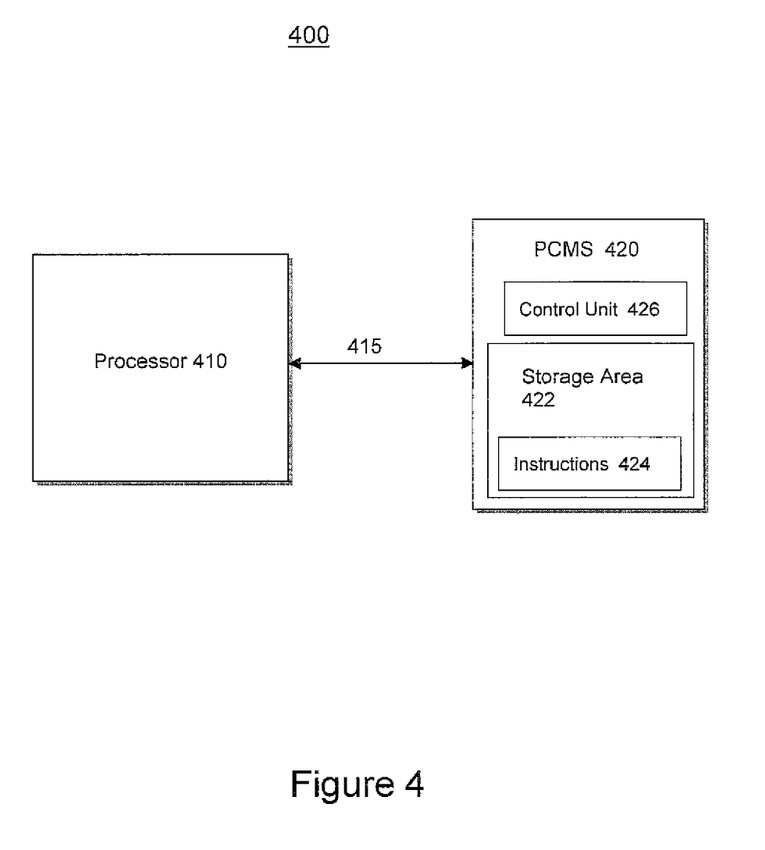
FIG. 4 is a schematic block diagram depicting a system, including a cross-point array memory device, according to an embodiment.

FIG. 4 is a schematic block diagram depicting an example system 400 including an example PCMS 420. In an embodiment, PCMS 420 may comprise a storage area 422 including a PCMS cross-point memory array, such as in accordance with one or more of examples. PCMS 420 may, in an example embodiment, be coupled to a processor 410 by way of an interconnect 415.

PCMS 420 in an embodiment may comprise a control unit 426. Additionally, storage area 422 may store instructions 424 that may include one or more applications that may be executed by processor 410, according with an embodiment. Processor 410 may transmit a memory access command to PCMS 420, for example. Control unit 426 may access one or more memory cells of storage area 422 at least in part in response to receiving the memory access command from processor 410, according to an embodiment. Of course, computing platform 400 is merely one example of a system implemented in accordance with claimed subject matter, and the scope of claimed subject matter is not limited in these respects.

The term "computing platform" as used herein refers to a system and/or a device that includes the ability to process and/or store data in the form of signals or states. Thus, a computing platform, in this context, may comprise hardware, software, firmware or any combination thereof (other than software per se). Computing platform 400, as depicted in FIG. 4, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, or any combination of the above. Further, unless specifically stated otherwise, a process as described herein, with reference to flow diagrams or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Methodologies described herein may be implemented by various techniques depending, at least in part, on applications according to particular features or examples. For example, methodologies may be implemented in hardware, firmware, or combinations thereof, along with software (other than software per se). In a hardware embodiment, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other devices units designed to perform the functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

Some portions of the preceding detailed description have been presented in terms of logic, algorithms and/or symbolic representations of operations on binary states stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions and/or symbolic representations are examples of techniques used by those of ordinary skill in the signal processing and/or related arts to convey the substance of their work to others skilled in the art. An algorithm is here, and generally, is considered to be a self-consistent sequence of operations and/or similar signal processing leading to a desired result. In this context, operations and/or processing involve physical manipulation of physical quantities. Typically, although not necessarily, such quantities may take the form of electrical and/or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", or the like may refer to actions and/or processes of a specific apparatus, such as a special purpose computer or a similar special purpose electronic computing device. In the context of this specification, therefore, a special purpose computer and/or a similar special purpose electronic computing device is capable of manipulating and/or transforming signals, typically represented as physical electronic and/or magnetic quantities within memories, registers, and/or other information storage devices, transmission devices, or display devices of the special purpose computer and/or similar special purpose electronic computing device. In the context of this particular patent application, the term "specific apparatus" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change and/or transformation in magnetic orientation or a physical change and/or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory and/or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

While there has been illustrated and/or described what are presently considered to be example features, it will be understood by those skilled in the art that various other modifications may be made, and/or equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and/or equivalents thereof.

The invention claimed is:

1. A method, comprising:
receiving one or more signals indicative of a memory access command from a processor of a computing platform; and
accessing a phase change memory with selector (PCMS) comprising an array of L-shaped storage components in response to receiving the one or more signals, wherein the accessing comprises changing a state of at least one L-shaped storage component of the array through a first electrode, wherein each L-shaped storage component of the array comprises an L-shaped storage material comprising a first portion extending from the first electrode positioned below the L-shaped storage material to a second electrode positioned above or on the L-shaped storage material, each L-shaped storage component of the array comprising a selector material positioned above or on the second electrode and a third electrode positioned above or on the selector material, wherein the first portion of the L-shaped storage material comprises a reduced size storage component in a first dimension, and wherein the first electrode is positioned above and on a dielectric material and in contact with a second portion of the L-shaped storage material comprising a second reduced size storage component extending in a second dimension, wherein the L-shaped storage component is positioned below and in contact with a second dielectric material, wherein the second dielectric material is positioned below and in contact with a third dielectric material of uniform width, wherein a first side of the third dielectric material extending in the first dimension is in parallel with a second side of the third dielectric material extending the first dimension.

2. The method of claim 1, further comprising:
applying a programming current to the PCMS based at least in part on an aspect ratio corresponding to the reduced size storage component, wherein the aspect ratio is at least partially affected by a thickness of the reduced size storage component in the second dimension.

3. The method of claim 2, wherein the aspect ratio is at least partially affected by a thickness of the L-shaped storage material in a third dimension.

4. The method of claim 3, wherein the second dimension is approximately orthogonal to the third dimension.

5. A method, comprising:
receiving one or more signals indicative of a memory access command from a processor of a computing platform; and
accessing a memory device with a storage cell through a first electrode in response to receiving the one or more signals, wherein accessing the memory device comprises changing a state of the storage cell, and wherein the storage cell comprises:
an L-shaped storage component having a first portion extending from the first electrode positioned below the L-shaped storage component to a second electrode positioned above or on the L-shaped storage component, wherein the first electrode is positioned above and on a dielectric material and in contact with a second portion of the L-shaped storage component comprising a second reduced size storage component extending in a second dimension,
a second dielectric material positioned above and in contact with the L-shaped storage component;
a third dielectric material of uniform width positioned above and in contact with the second dielectric material, wherein a first side of the third dielectric material extending in a first dimension is in parallel with a second side of the third dielectric material extending in the first dimension;

a selector material positioned above or on the second electrode, and a third electrode positioned above or on the selector material, wherein the first portion of the L-shaped storage component comprises a reduced size storage component in the first dimension.

6. The method of claim 5, wherein the storage cell comprises a phase change memory with selector (PCMS) storage cell.

7. The method of claim 6, wherein the storage cell further comprises an integrated self-heating structure.

8. The method of claim 5, further comprising:
applying a programming current to the storage cell based at least in part on an aspect ratio of the L-shaped storage component corresponding to the reduced size storage component, wherein the aspect ratio is at least partially affected by a thickness of the reduced size storage component in the second dimension.

9. The method of claim 8, wherein the aspect ratio is at least partially affected by a thickness of the reduced size storage component in a third dimension.

10. The method of claim 9, wherein the second dimension is approximately orthogonal to the third dimension.

11. A method, comprising:
receiving one or more signals indicative of a memory access command from a processor of a computing platform; and accessing a first memory device having a first set of storage components in response to receiving the one or more signals, wherein accessing the first memory device comprises changing a state of at least one of the first set of storage components, the first memory device comprising:

a first trench within a dielectric material, the first trench extending in a first direction, a second trench within the dielectric material, the second trench extending in a second direction orthogonal to the first direction, the first set of storage components positioned along the first direction in the first trench, a first electrode material positioned over the first set of storage components, a third trench extending in the first direction through the first electrode material, a plurality of electrodes positioned along the first direction adjacent to the third trench, wherein each of the plurality of electrodes is positioned below at least one of the first set of storage components, and wherein each of the plurality of electrodes is positioned above and on a second dielectric material, a fourth trench extending in the second direction through the first electrode material and through at least a portion of the dielectric material, wherein the size of the first set of storage components is affected at least in part by the first trench, the second trench, the third trench, and the fourth trench, a third dielectric material positioned above and in contact with at least one of the first set of storage components, and a fourth dielectric material of uniform width positioned above and in contact with the third dielectric material, wherein a first side of the fourth dielectric material extends in a third direction orthogonal to the first direction and the second direction and is in parallel with a second side of the fourth dielectric material extending in the third direction.

12. The method of claim 11, wherein the first memory device further comprises:
a selector material positioned over the first electrode material, and a second electrode material over the selector material, wherein the second trench and the third trench each extend through the selector material and the second electrode material, and wherein the first memory device is accessed based at least in part on the first memory device containing the selector material and the second electrode material.

13. The method of claim 12, further comprising:
accessing a second memory deck in response to receiving the one or more signals, the second memory deck positioned over the second electrode material, and the second memory deck comprising:

a first plurality of electrodes each in electronic communication with at least the second electrode material, a second set of storage components positioned over each of the first plurality of electrodes, and a second plurality of electrodes positioned over the second set of storage components, wherein the second plurality of electrodes is in electronic communication with the second set of storage components positioned over the first plurality of electrodes.

14. The method of claim 13, further comprising:
accessing a plurality of memory decks in response to receiving the one or more signals, the plurality of memory decks positioned over the second memory deck, the plurality of memory decks each comprising:

a third plurality of electrodes, a third set of storage components positioned over the third plurality of electrodes, and a fourth plurality of electrodes positioned over each of the third set of storage components, wherein the fourth plurality of electrodes is in electronic communication with the third set of storage components positioned over the third plurality of electrodes.

15. The method of claim 13, wherein each of the second set of storage components positioned over each of the first plurality of electrodes comprises:
a first portion extending in the first direction, and a second portion extending in the second direction, wherein the second direction is orthogonal to the first direction, wherein the first portion and the second portion of the second set of storage components are associated with an aspect ratio, and wherein the second memory deck is accessed based at least in part on the aspect ratio.

16. The method of claim 15, wherein the second portion of each of the second set of storage components is in contact with at least a portion of the first plurality of electrodes, wherein the second memory deck is accessed based at least in part on the second portion of each of the second set of storage components being in contact with at least the portion of the first plurality of electrodes.

17. The method of claim 11, wherein each of the first set of storage components comprise a chalcogenide material, wherein the first memory device is accessed based at least in part on the first set of storage components comprising the chalcogenide material.

18. The method of claim 11, wherein the first memory device comprises one or more phase change memory with selector (PCMS) storage cells.

* * * * *